United States Patent
Fork

(12) 
(10) Patent No.: US 6,339,289 B1
(45) Date of Patent: Jan. 15, 2002

(54) METHOD AND APPARATUS TO LIMIT DARK SPOT PROPAGATION IN ORGANIC LIGHT EMITTING DIODES

(75) Inventor: David Kirtland Fork, Los Altos, CA (US)

(73) Assignee: Xerox Corporation, Stamford, CT (US)

(*) Notice: Subject to any disclaimer, the term of this patent is extended or adjusted under 35 U.S.C. 154(b) by 0 days.

(21) Appl. No.: 09/121,822

(22) Filed: Jul. 24, 1998

(51) Int. Cl.[7] .............................. H01J 1/62; H01J 63/04; G09G 3/14; G09G 3/30
(52) U.S. Cl. ...................... 313/506; 313/500; 313/507; 313/509; 345/46; 345/76; 345/80
(58) Field of Search ................................. 313/500, 504, 313/505, 506, 507, 509, 512; 345/45–46, 76, 80

(56) References Cited

U.S. PATENT DOCUMENTS

| | | | | |
|---|---|---|---|---|
| 5,701,055 A | * | 12/1997 | Nagayama et al. | 313/504 |
| 5,739,545 A | * | 4/1998 | Guha et al. | 313/504 X |
| 5,763,110 A | * | 6/1998 | Hu et al. | 313/504 X |
| 5,909,081 A | * | 6/1999 | Eida et al. | 313/504 |
| 5,925,472 A | * | 7/1999 | Hu et al. | 313/504 X |
| 5,962,962 A | * | 10/1999 | Fujita et al. | 313/509 X |
| 5,990,615 A | * | 11/1999 | Sakaguchi et al. | 313/504 |

OTHER PUBLICATIONS

C. Hosokawa, et al., "L2.3: Organic Multicolor EL Display with Fine Pixels", SID 97 Digest, pp. 1073–1076, 1997.

* cited by examiner

Primary Examiner—Vip Patel
Assistant Examiner—Mack Haynes
(74) Attorney, Agent, or Firm—Oliff & Berridge, PLC

(57) ABSTRACT

A mechanism for deterring dark spot propagation by dividing the active emitting area, i.e., pixel, of each light emitting device into sub-regions that are separated by a dielectric barrier. This division prevents spreading of one affected region to adjacent current carrying regions. A side benefit of the division is improved out-coupling of light from the active emitting area of the light emitting device because the morphology resulting from the incorporation of the dielectric barrier can be configured to increase the externally radiated, and thereby collectable, portion of the generated light.

27 Claims, 3 Drawing Sheets

METHOD AND APPARATUS TO LIMIT DARK SPOT PROPAGATION IN ORGANIC LIGHT EMITTING DIODES

BACKGROUND OF THE INVENTION

1. Field of Invention

This invention relates to light emitting diodes. In particular, this invention is directed to a method and apparatus that improves device stability of a light emitting device pixel by limiting dark spot propagation.

2. Description of Related Art

Dark spot propagation is the propagation of non-operative, i.e., dark, areas in an organic layer, e.g., an electron transport layer, of a light emitting device. Dark spot propagation destroys the emission capability of light emitting diodes in image displays and light-emitting bars used for printing.

Although dark spot propagation effects all types of light emitting devices, polymeric and small-molecule based organic light emitting diodes (OLEDs) suffer an increased susceptibility to dark spot propagation. Dark spots result from defects, such as, for example, physical defects resulting during fabrication. These physical defects can occur because of extraneous unwanted material disposed during formation of the constituent layers of the OLED structure and are on the order of 1 micrometer in diameter or smaller. These dark spots spread from the cathode region of the light emitting diode into regions that carry current.

FIG. 1 illustrates the fabricated layers of a conventional OLED structure 100 including a substrate 105 made of, for example, glass, an anode 110 made of, for example, indium tin oxide (ITO), a hole injecting layer 120, a hole transmission layer 130 made of, for example, N, N'-diphenyl-N, N-bis(3-methylphyenyl)1,1'-biphenyl-4,4'diamine (TPD), an electron transmission layer 140 made of, for example, tri(8-hyrdoxyquinoline) aluminum ($Alq_3$), and a cathode layer 150 made of, for example, a Magnesium Silver (MgAg) alloy. The Mg cathode provides an appropriate workfunction for efficient electron injection. As shown in FIG. 1, a physical defect 200 on the substrate 100 translates into a discontinuity in the cathode layer 150. This discontinuity gives rise to a dark spot, i.e., a non-emitting area in a pixel because the dark spot is not structured properly to emit light.

During fabrication, measures can be taken to minimize the number of dark spots. However, once a dark spot is produced during fabrication, the dark spot can spread to adjacent pixels. This propagation of the dark spots reduces the light emitting capability of light emitting devices. A finite density of dark spot nuclei is deemed inevitable in any realistic diode array process unless exposure to all unwanted defects can be eliminated in the fabrication process. Therefore, it is incredibly difficult to eliminate the dark spot propagation phenomena by eliminating dark spots during fabrication.

The propagation of dark spots is caused by a number of factors. Dark spots grow in the organic layers of the diode due to the presence of moisture. However, the susceptibility of a device to dark spot propagation appears to depend on the material used, such as for example, the organic layers used in an OLED. As mentioned above, dark spot propagation significantly affects the cathode contact of an OLED.

FIG. 2 shows an optical micrograph of an OLED with dark spot propagation. The light areas are those areas where the active region is still emitting light. The dark areas are those areas that are affected by dark spot propagation and no longer emit light.

Because it is believed that moisture is involved in the degradation of organic layers, hermetic packaging of OLEDs has been used to slow the propagation of dark spot defects in the organic layers by prohibiting the presence of moisture. However, all hermetic packaging will leak in moisture at a finite rate, leading to an eventual permeation of the package with moisture.

Another solution for dark spot propagation is to increase the cathode thickness to better cover any physical defects formed in the organic layer. However, increasing the cathode thickness increases the costs and time associated with fabrication and may not be a significant deterrent to dark spot propagation.

Alternatively, additional material can be deposited between the bottom-most OLED layer and the substrate. One such additional material, for example, is PANI (Polyanaline), which is electrically conducting and conformal to the surface, so that the surface becomes smoother. However, depositing of this additional material also increases the costs and time associated with fabrication.

SUMMARY OF THE INVENTION

In the extreme case, dark spot propagation causes the cathode of an OLED to actually delaminate, i.e., separate, from the organic layer disposed below the cathode. Delamination actually allows even more moisture to degrade the organic layer further compounding the degradation. FIG. 3 shows a planar view of an OLED showing the edge of the light emitting area as viewed from the cathode side. In FIG. 3, the current flow is normal to the paper. The effect of dark spot propagation is that the ordinarily shiny cathode metal is blistered in the light emitting portion or area. The light emitting portion of the diode is defined by the crossed portions of the cathode made of MgAg and anode stripes made of indium tin oxide (ITO). That is, blistering and delamination occur only in the regions that carry current through the cathode-organic layer interface, as illustrated in FIG. 3. Where no current flows, no blistering occurs. Additionally, the blistering stops where the light emitting area stops.

The unblistered cathode metal outside the active region of the diode in FIG. 3 transports current parallel to, but not across, the diode interface, i.e., the interface between the cathode and the electron transport layer. Therefore, the dark spot propagation mechanism appears to be stimulated by the passage of current from the cathode into the organic layers.

This invention provides a mechanism including a method and apparatus for deterring dark spot propagation.

This invention deters dark spot propagation by dividing the active emitting area of each light emitting device into sub-regions that are separated by a dielectric barrier. This division prevents spreading of one dark spot affected sub-region to adjacent current carrying sub-regions. A side benefit of the division is improved out-coupling of light from the active emitting area of the light emitting device because the morphology resulting from the incorporation of the dielectric barrier can be configured to increase the amount of externally radiated, and thereby collectable, portion of the generated light.

In a preferred embodiment of the invention, lithographic patterning is used to create a layered structure with a dielectric barrier that is patterned onto the anode in order to divide the anode into electrically isolated sub-regions.

BRIEF DESCRIPTION OF THE DRAWINGS

The preferred embodiment of this invention will be described in detail, with reference to the following figures, wherein.

DETAILED DESCRIPTION OF PREFERRED EMBODIMENTS

Figure 1:
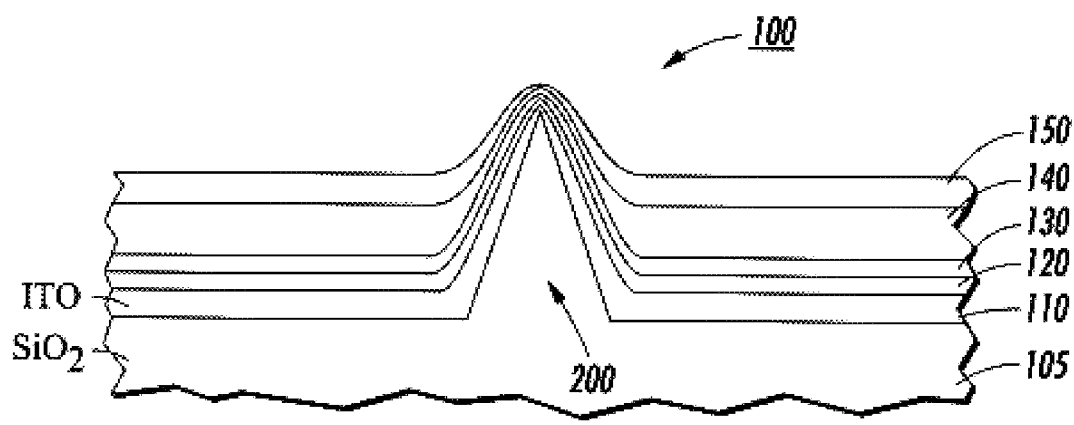
FIG. 1 illustrates the fabrication structure of an OLED with a physical defect in the substrate.
Figure 2:
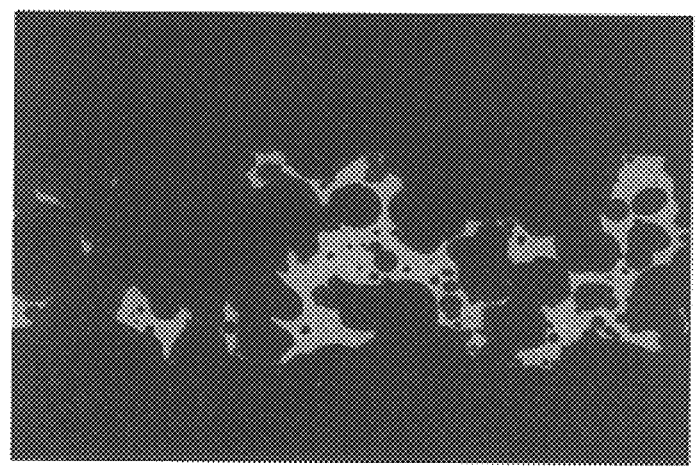
FIG. 2 shows an optical micrograph of an OLED affected by dark spot propagation.
Figure 3:
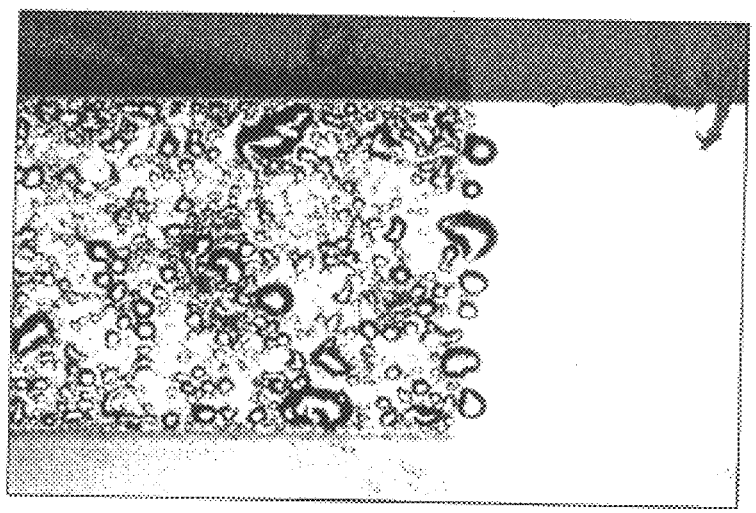
FIG. 3 shows the edge of the light emitting area as viewed from the cathode side.
Figure 4:
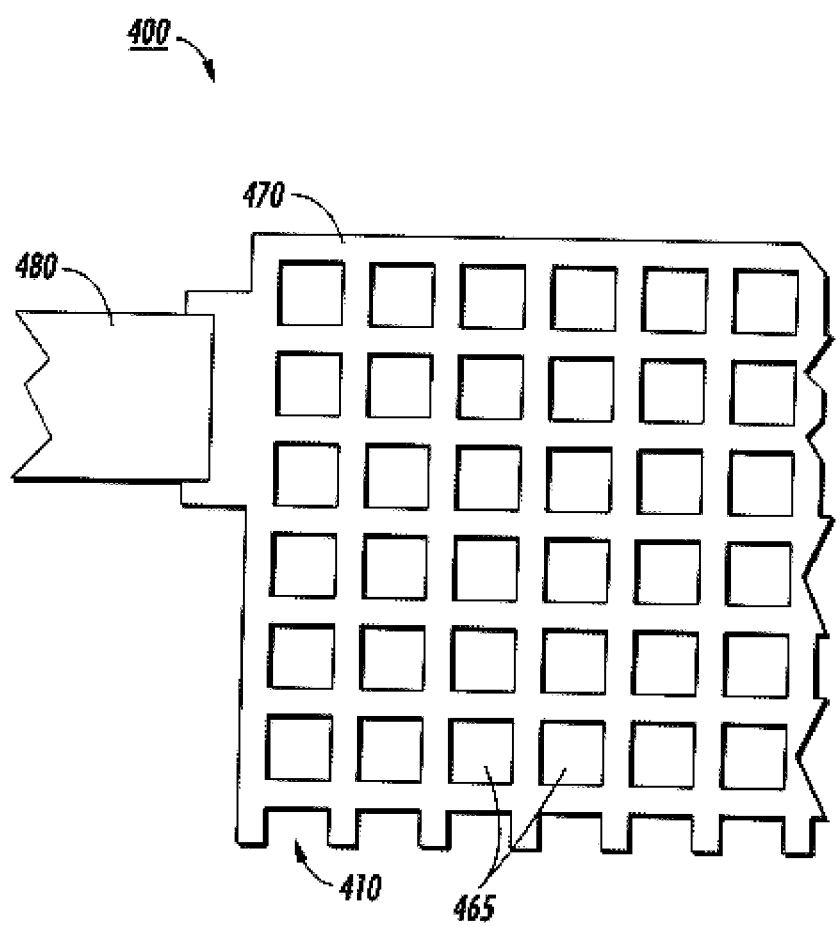
FIG. 4 is a top plan view of a light emitting device structure divided into sub-regions on the cathode of the light emitting device.
Figure 5:
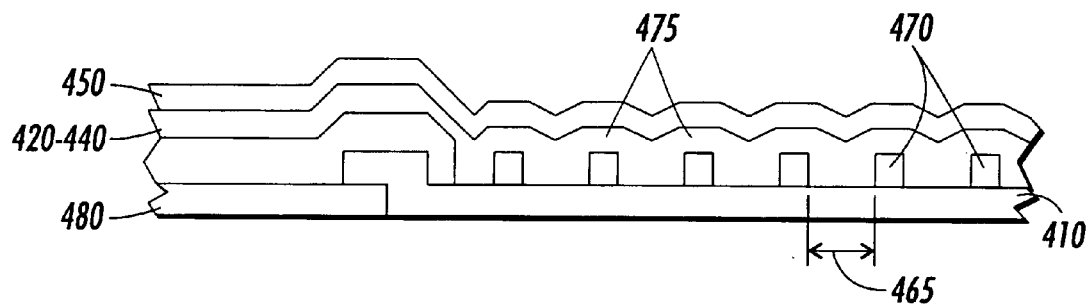
FIG. 5 is a side view of the light emitting device structure illustrated in FIG. 4.

FIGS. 4 and 5 illustrate a light emitting device 400 according to a preferred embodiment of the invention. As shown in FIG. 4, the sub-regions 465 are formed within the active light emitting area 460 by disposing a dielectric barrier grid 470 on an anode 410. The active light emitting area 460 is connected to a drive electrode or drive transistor 480. As shown in FIG. 5, a side view of the device shown in FIG. 4, the structure of the light emitting device 400 includes the anode 410, a hole injecting layer 420, a hole transmission layer 430, an electron transmission layer 440 and a cathode layer 450. As shown in FIGS. 4 and 5, the light emitting device 400 is structured to limit propagation of dark spot defects by dividing the active light emitting area 460 into the sub-regions 465.

Dark spot defects are prevented from spreading from an affected sub-region 465 to an adjacent sub-region 465 by localizing the electrical degradation process within one sub-region 465. This is performed by isolating dark spots using a dielectric barrier grid 470 deposited on the active light emitting area 460 to divide the active light emitting area 460 into sub-regions 465. Because a single drive electrode or drive transistor 480 controls current flow to the entire light emitting device 400, all of the sub-regions 465 operate in parallel.

As shown in FIG. 4, the white squares are vias through the dielectric barrier grid 470 into the anode 410. Because the dielectric barrier grid 470 is made of a dielectric material current does not flow between the sub-regions 465.

FIGS. 4 and 5 illustrate a common cathode device including the dielectric barrier grid 470 according to this invention. However, the method and apparatus according to this invention may be constructed in other ways as well. For example, the dielectric barrier can be formed above or within, rather than below, the organic layers. This construction would still restrict the flow of current to sub-region of within each pixel. Forming such a barrier however, would require processing of the dielectric to form vias, after the organic layers have been deposited. This procedure may be more difficult because the organic materials currently used are moisture sensitive, and may degrade during the processing of the dielectric layer.

The approach of using sub-regions to limit dark spot propagation may also be applied to common anode light emitting devices as well as to passive matrix devices. In a common anode light emitting device, dividing the light emitting area into sub-regions may be performed in a fashion similar to that described for common cathode devices by introducing a patterned dielectric layer with via holes between the electrodes of the device. Common anode devices may be more difficult to process because of the requirements for patterning the cathode, which is typically a low workfunction metal such as Mg, and is hence typically sensitive to moisture. A dry patterning process is preferable. Thus, currently the light emitting device 400 shown in FIGS. 4 and 5 is preferred over a common anode light emitting device because methods for completely dry processing of device structures after the organic layer deposition step are either difficult or nonexistent.

In the case of passive matrix devices, the cathode may be patterned by techniques such as stencil masking or by forming dovetails on the substrate for electrode spacing prior to the organic layer and cathode deposition as described by Hosokawa et al. (C. Hosokawa et al., Organic Multicolor EL Display with Fine Pixels, Society for Information Display 1997 Digest, pp. 1073–1076), incorporated by reference in this application. Division of the pixels in a passive matrix device into sub-regions to limit dark spot propagation can be achieved as before, by introducing a patterned dielectric layer with via holes between the anode and cathode of each pixel. The processing of this dielectric layer may be least complicated if it is introduced at a stage before either the cathode or the organic layers have been deposited. Any conventional method for forming the organic layers may be used. However, it is preferable to avoid wet chemical processing after the organic layers are formed because water is a vigorous assailant of the organic layers and can also damage the cathode.

Figure 6:
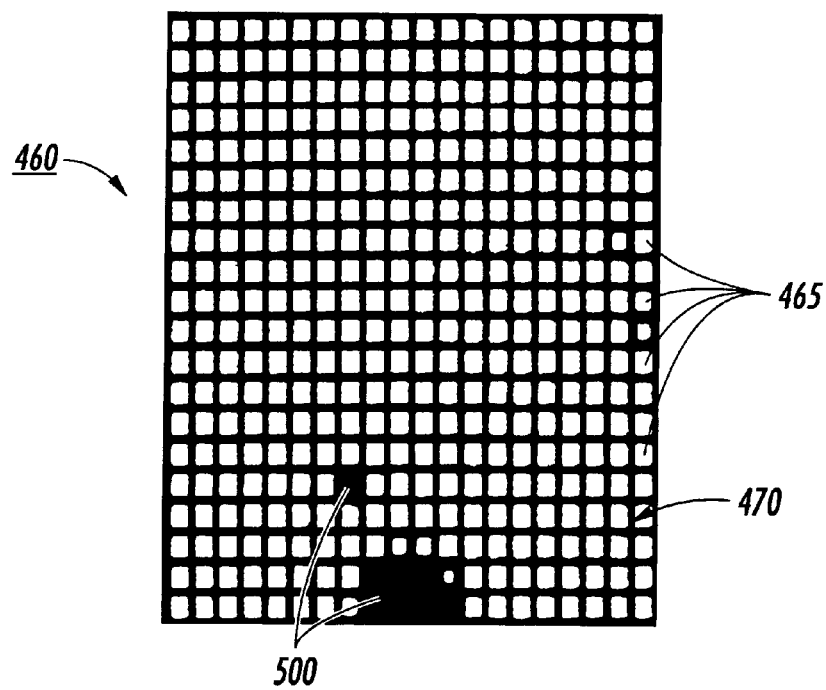
FIG. 6 illustrates an explanatory diagram of the physical ramifications of dividing a light emitting device into sub-regions.

FIG. 6 illustrates the scientific principals that allow the dielectric barrier grid 470 to effectively prevent dark spot propagation. As shown in FIG. 6, a dark spot 500 in one of the sub-regions 465 is prevented from propagating to an adjacent sub-region 465 because the sub-regions are electrically isolated from one another by the dielectric barrier grid 470. Because the dark spot 500 does not propagate without the flow of current, dark spot propagation is prevented by electrically isolating the sub-regions 465.

The conductivity of the organic layers, e.g., the hole injecting layer 420, the hole transmission layer 430 and the electron transmission layer 440, is poor in comparison to the anode layer 410 and the cathode layer 450. The current flows along the path of minimum resistance. Therefore, the current will tend to favor a vertical path across the organic layers rather than traveling laterally within the organic layers. Without the dielectric barrier grid 470, there is a constant current density between the cathode layer 450 and the anode 410, which fosters dark spot propagation.

The spreading resistance, i.e., the resistance seen by a charge attempting to flow parallel to the anode 410 through the organic layers, is large in comparison to the direct path across the organic layers. This spreading resistance in the light emitting devices is very large due to the low mobility and carrier density of the organic materials forming the organic layers.

The dielectric barrier grid 470 limits the current flow between the sub-regions 465 because the sub-regions 465 are electrically isolated from each other. That is, no electric current flows between the sub-regions 465 crossing the interface between the sub-regions 465 because of the dielectric barrier grid 470. The lateral extent of the dielectric barrier grid 470 need not be large to block current from flowing in the organic layer. Dielectric barriers, may be, for example, approximately 10 microns wide on a top surface and define 20 micron square sub-regions in the active light emitting area. Additionally, dividing the light emitting area into sub-regions should not detract from the viewing effect. Human visual resolution at normal reading distance is approximately 85 microns. Thus, in the method and apparatus according to this invention, there will be no detrimental effects on the viewing quality of the active light emitting area. Dividing the light emitting area into sub-regions 465 should be beyond the resolution of the human eye. A dielectric grid with vias on 30 micron pitch results in one hundred sub-regions in a 300 micron square pixel.

Therefore, narrow dielectric barrier grid regions, which consume small quantities of device area, are sufficient to arrest the propagation of dark spot defects. The deposition of the dielectric barrier grid 470 does not necessarily require higher resolution alignment tolerances because the alignment properties apply to the entire field of the active light emitting area rather than to individual sub-regions 465.

There are many possible process sequences that may be employed to divide the light emitting area into sub-regions. The dielectric barrier grid 470 may be formed by depositing an insulating mask on top of the anode 410 to divide the anode 410 into separate electrical units forming the sub-regions 465. To create the patterned anode structure shown in FIGS. 4 and 5, the drive electrode 480 material is deposited on a substrate by sputter depositing in a sputter deposition chamber. Next, the drive electrode 480 is patterned by etching. The current flow through the cathode-organic interface can be pixelated by patterning the anode 410, and divided into sub-regions by patterning the dielectric barrier grid 470 over the anode 410. The ITO anode 410 is sputter deposited and patterned into pixels using photolithography. Next, the ITO anode 410 is annealed using, for example, rapid thermal processing. The dielectric material for the dielectric barrier grid 470 is deposited over the anode 410 and patterned into the grid pattern to form sub-region vias. Subsequently, the organic layers 420–440, e.g., TPD and Alq, are evaporated over the anode 410 and the dielectric barrier grid 470. Then the cathode 450 made of, e.g., Mg:Ag, is evaporated over the dielectric layers 420–440.

As a result of wave-guiding scattering within the sub-regions 465, i.e., the out-coupling of modes that are otherwise confined by total internal reflection, the external quantum efficiency and substrate radiation mode coupling of the OLED pixels is significantly improved. That is, the dielectric grid barrier 470 acts as a mechanism on the surface of the active light emitting area 460 to improve coupling of the amount of internal light out of the light emitting device and into the radiation modes emitted from the light emitting device. This improves the external quantum efficiency, i.e., the ratio of the photons that escape the device to the electrons passed through the device, and thus, increases the number of photons available for external viewing.

External quantum efficiencies of conventional OLEDs are typically approximately 3%. The external quantum efficiency differs significantly from the internal quantum efficiency, which counts all the photons produced by the light emitting device. Internal quantum efficiencies of conventional OLEDs are typically approximately 15% or 20%. The theoretical quantum mechanical limit for internal quantum efficiency is 25%. Therefore, conventional technology is providing close to optimum results for the internal quantum efficiency.

However, in conventional light emitting devices without division into sub-regions, photons emitted parallel to or at grazing incidence to the substrate either exit from the edges of the substrate or cause interpixel bleeding. In these conventional devices, wave-guiding and substrate radiation mode coupling can also result in a reduction of the modulation transfer function (MTF) of the display in which the pixels are located due to interpixel bleeding of the emitted light. The MTF of an optical system is the ratio of the modulation of an optical image to that of the object. Reducing the modulation transfer function (MTF) reduces the crispness of the display. Because of wave-guiding, two adjacent pixels may have cross-talk, i.e., photons generated in one pixel exit the area associated with another pixel.

A significant benefit of the method and apparatus according to this invention is that, within a single active light emitting area 460, waveguiding may be performed to cause normally internal photons to be emitted using the dielectric barrier grid 470. Waveguiding is performed within the sub-regions 465. When using waveguiding with the dielectric barrier grid 470, it is not important that the photon emitted in one sub-region 465 be emitted in the area associated with that particular sub-region. A photon generated in one sub-region 465 may be emitted from an adjacent sub-region 465 of the same pixel 460. This type of "intra-sub-region bleeding" is advantageous because it improves the brightness of the pixel 460 by using the positive ramifications of waveguide scattering and substrate radiation mode coupling without reducing the MTF because of interpixel bleeding.

Scattering the generated photons that would otherwise be trapped inside the device by total internal reflection requires a morphology, i.e., surface topography, with spatial frequency components on the order of the photon's propagation constant, $\beta$, where:

$$\beta = 2\pi n/\lambda,$$

where:

n is the effective index of refraction; and $\lambda$ is the wavelength of the photons.

The morphology generated by the dielectric barrier grid 470, which defines the sub-regions 465, increases the externally radiated fraction of the generated light. As a result, properly processing the electrode and dielectric edges and surfaces according to the method of this invention should optimize the output scattering. Therefore, the intra-sub-region bleeding effect can be exploited to fully compensate for any reduction of the active device area, i.e., the pixel aperture ratio, resulting from incorporation of the dielectric barrier grid 470.

The method and apparatus according to this invention may be used with many types of light emitting devices, e.g., OLEDs and inorganic light emitting diodes. OLEDs radiate a small fraction of the generated protons because approximately 80% of the light generated by the OLED is trapped in the diode. The refractive index of an inorganic LED is higher than an OLED, so the problem of poor external quantum efficiency is magnified.

The method and apparatus according to the invention can be used in an image bar in which many light emitting devices emit through a lens onto a photoreceptor.

While this invention has been described in conjunction with a preferred specific embodiment outlined above, it is evident that many alternatives, modifications and variations will be apparent to those skilled in the art.

For example, the light emitting device may be an organic or inorganic light emitting diode. Also, the concept of division into sub-regions may be applied to common anode designs as well as to passive matrix schemes.

Additionally, it is not necessary that the dielectric barrier be disposed in a grid shape. The concept of dividing the light emitting area into sub-regions may be performed by dividing a pixel into a plurality of sub-regions so that dark spots in one of the sub-regions are prohibited from propagating to another sub-region.

Accordingly, the preferred embodiment of the invention, as set forth above, is intended to be illustrative, not limiting. Various changes may be made without department from the spirit and scope of the invention.

What is claimed is:

1. A light emitting device comprising:
    a substrate;
    an electrode formed over the substrate, the electrode is patterned to form at least one pixel region, each pixel region comprises a plurality of sub-regions which are electrically connected to each other in parallel and simultaneously activated; and
    at least one drive electrode over the substrate, the number of the at least one drive electrode equals the number of the at least one pixel region, and each drive electrode is connected to one said pixel region,
    wherein each pixel region is separately driven.

2. The light emitting device of claim 1, further comprising a barrier over a surface of the electrode forming the pixel region, the barrier separating the pixel region into the plurality of sub-regions.

3. The light emitting device of claim 2, wherein adjacent sub-regions are electrically isolated from each other by the barrier.

4. The light emitting device of claim 3, wherein a dark spot in a first sub-region of the plurality of sub-regions is prohibited from propagating to an adjacent second sub-region of the plurality of sub-regions by the barrier.

5. The light emitting device of claim 2, wherein each pixel region further comprises an anode layer, a cathode layer and organic layers, said organic layers comprising:
    a hole injecting layer;
    a hole transmission layer; and
    an electron transmission layer;
    wherein, the dielectric barrier is formed over the anode layer.

6. The light emitting device of claim 5, wherein, a conductivity of the organic layers is lower than a conductivity of the cathode layer.

7. The light emitting device of claim 2, wherein the barrier prohibits current flow between adjacent sub-regions.

8. The light emitting device of claim 2, wherein the barrier is a dielectric barrier.

9. The light emitting device of claim 8, wherein the dielectric barrier comprises a top surface approximately 10 microns wide and the dielectric barrier defines 20 micron square sub-regions in a light emitting area.

10. An image forming device including the light emitting device of claim 1.

11. The image forming device of claim 10, wherein the image forming device is a scanner, a facsimile machine, a printer, a digital copier, a raster output scanner, an image bar, or a flat panel display.

12. An image forming device comprising a light emitter, the light emitter including at least one light emitting device according to claim 1.

13. The image forming device of claim 2, wherein the light emitter is a raster output scanner or an image bar.

14. The light emitting device of claim 1, wherein adjacent sub-regions are electrically isolated from each other.

15. The light emitting device of claim 1, wherein a dark spot in a first sub-region of the plurality of sub-regions is prohibited from propagating to an adjacent second sub-region of the plurality of sub-regions.

16. The light emitting device of claim 1, wherein each pixel region further comprises.
    organic layers;
    a hole injecting layer;
    a hole transmission layer; and
    an electron transmission layer; and
    wherein, dividing the pixel into a plurality of sub-regions is performed by patterning the organic layers.

17. The light emitting device of claim 1, wherein the light emitting device is a common cathode device.

18. The light emitting device of claim 1, wherein the light emitting device is a common anode device.

19. The light emitting device of claim 1, wherein the light emitting device is used in a passive matrix device.

20. A method for limiting dark spot propagation in a light emitting device, the method comprising:
    forming a substrate;
    forming an electrode over the substrate;
    patterning the electrode to form at least one pixel region, each pixel region being separately driven;
    forming at least one drive electrode on the substrate, the number of the at least one drive electrode formed on the substrate equaling the number of the at least one pixel region, and each drive electrode being connected to one said pixel region; and
    dividing the pixel region into a plurality of sub-regions being electrically connected to each other in parallel and simultaneously activated.

21. The method of claim 20, wherein dividing the pixel region into a plurality of sub-regions is performed by forming a dielectric barrier layer over the electrode and patterning the dielectric barrier layer in each pixel region to form a dielectric barrier grid, the dielectric barrier grid dividing each pixel region into the plurality of sub-regions.

22. The method of claim 21, wherein the dielectric barrier layer is a grid deposited within the pixel.

23. The method of claim 20, further comprising:
    forming a hole injecting layer of an organic material in the pixel region;
    forming a hole transmission layer of an organic material in the pixel region;
    forming an electron transmission layer of an organic material in the pixel region; and
    forming a cathode layer in the pixel region.

24. The method of claim 23, wherein, the conductivity of the organic material layers is lower than the conductivity of the cathode layer.

25. A light emitting device, comprising:
    a substrate;
    an electrode formed over the substrate, the electrode is patterned to form at least one pixel region and each pixel region comprises a plurality of sub-regions which are electrically connected to each other in parallel and simultaneously activated;
    at least one drive electrode over the substrate, the number of the at least one drive electrode equals the number of the at least one pixel region, and each drive electrode is connected to one said pixel region; and a dielectric barrier over a surface of the electrode forming the pixel region, the dielectric barrier having a grid pattern that separates the pixel region into the plurality of sub-regions;

wherein adjacent sub-regions are electrically isolated from each other by the dielectric barrier.

26. The light emitting device of claim 25, wherein the grid pattern defines sub-region vias to the electrode.

27. The light emitting device of claim 20, wherein the dielectric barrier comprises a top surface approximately 10 microns wide and the dielectric barrier defines 20 micron square sub-regions in a light emitting area.

\* \* \* \* \*